United States Patent [19]

Santomango et al.

[11] Patent Number: 4,636,726

[45] Date of Patent: Jan. 13, 1987

[54] ELECTRONIC BURN-IN SYSTEM

[75] Inventors: Anthony Santomango, West Peabody; Nicholas N. Hatheway, Jr., Newbury, both of Mass.

[73] Assignee: Artronics Corporation, Danvers, Mass.

[21] Appl. No.: 718,939

[22] Filed: Apr. 2, 1985

Related U.S. Application Data

[62] Division of Ser. No. 336,781, Jan. 4, 1982, Pat. No. 4,542,341.

[51] Int. Cl.[4] .................. G01R 31/02; G01R 31/28
[52] U.S. Cl. .................. 324/158 F; 324/73 R; 361/413
[58] Field of Search .......... 324/158 F, 73 PC, 73 AT, 324/73 R, 158 R; 361/412, 413, 414

[56] References Cited

U.S. PATENT DOCUMENTS 4,468,616 8/1984 Yoshizaki ..................... 324/73 PC
4,488,354 12/1984 Chan et al. .................... 324/73 R
4,514,786 4/1985 Charruau ..................... 324/73 PC

OTHER PUBLICATIONS

Artronics Corporation Sales Literature ACSN-1014 Available to the Public More than One Year Prior to the Filing Date of the Parent Application.

Primary Examiner—Ernest F. Karlsen
Attorney, Agent, or Firm—Hamilton, Brook, Smith & Reynolds

[57] ABSTRACT

A system for performing electronic burn-in testing of a component comprising a rack (20) which is electrically connectable to a power source. A tray (50) is on the rack and a mother board (MB) associated with the tray is electrically connectable to the rack. A daughter board (DB) is electrically connectable to the mother board and to a component to be tested. The daughter board is electrically dedicated to the component but neither the tray nor the mother board are dedicated to the component.

3 Claims, 14 Drawing Figures

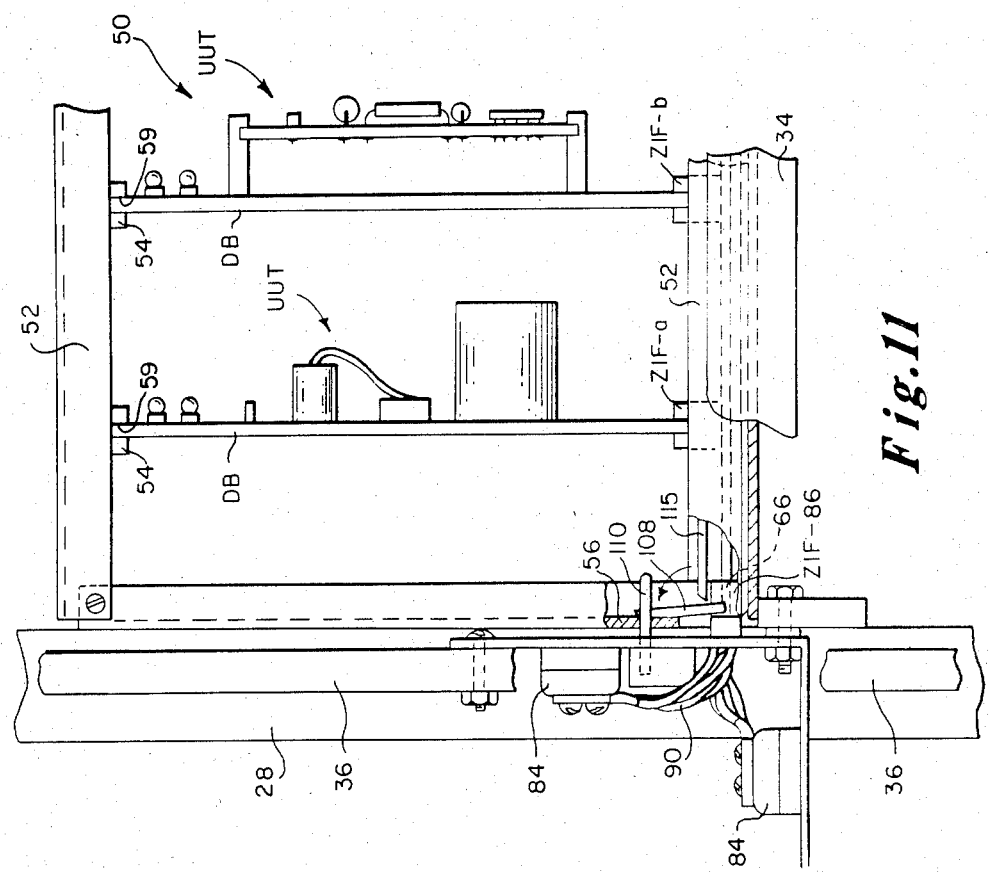
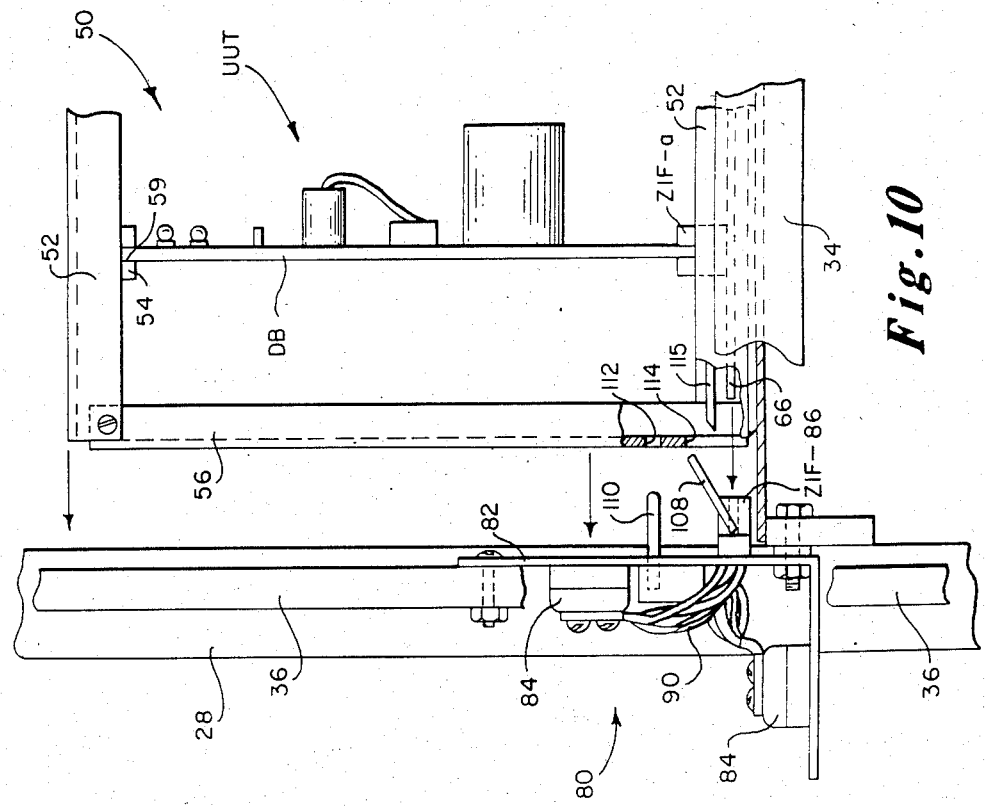
Fig.11
Fig.10

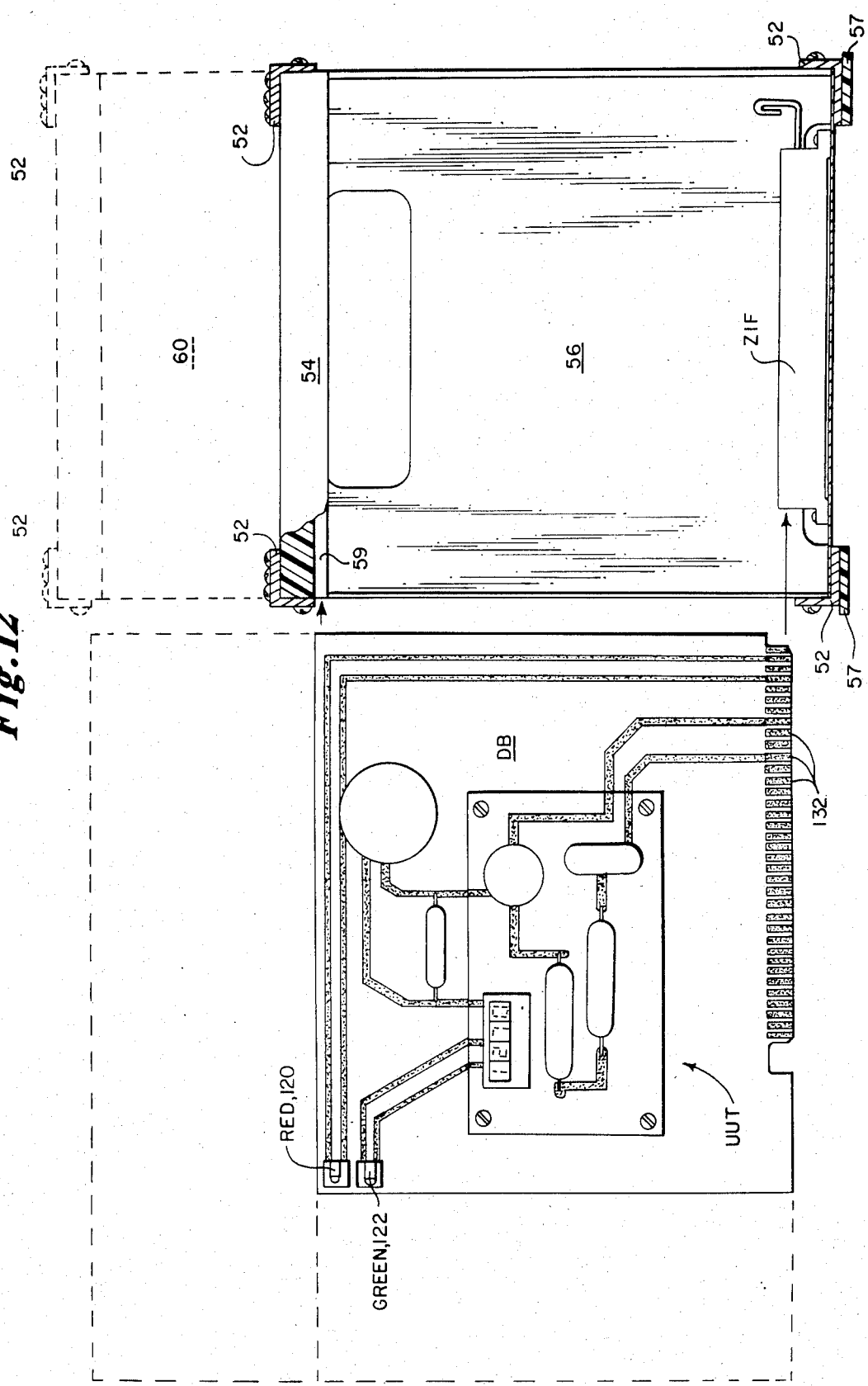

ELECTRONIC BURN-IN SYSTEM

This application is a division of application Ser. No. 336,781 filed Jan. 4, 1982, now U.S. Pat. No. 4,542,341.

TECHNICAL FIELD

This invention relates to test equipment and, more particularly, to equipment for testing electronic components prior to their actual usuage.

BACKGROUND OF THE INVENTION

It is common practice to test electronic components prior to their actually being installed. In the process, components are subjected to extreme conditions, greater than those they will experience in actual usage to weed out weak or defective parts. For example, it is not uncommon to test a component for hours, if not days, under temperature conditions approaching 85° C. Such testing is referred to as burning-in. There are a number of burn-in systems in use today. However, they tend to be very expensive because they are generally custom designed and dedicated only to a particular component or circuit to be tested. Applicants have been making customized burn-in racks for the electronics industry for some time which are designed specifically and wired precisely in accordance with the tests planned for the units to be tested. A system designed and hand wired to a specific component or circuit is known as a "dedicated" system.

Racks containing the units to be tested, are placed in temperature controlled chambers. The racks are wired into electronic test equipment which is usually outside the chamber in a separate control room. The control room contains a power source and various types of analytical equipment. In the prior art racks, the units under test are inserted directly into each rack. Thousands of wires connect the units under test to the power source.

Generally, after a period of time (a year or so), the user changes the specific product being tested because a new product has come along and replaced the earlier one, or the specific product has been modified. The only way to insert and test such a new product is to completely redesign or modify the rack wiring. This involves desoldering and complete refrabrication, often times costing in the hundreds of thousands of dollars in labor.

An object of the present invention is to provide a rack which is completely reusable requiring no desoldering and which is completely nondedicated to any particular unit to be tested.

It is also an object that the racks be completely adaptable to any unit to be tested and wherein two or more different units can simultaneously be tested without altering the wiring connecting the rack to the test equipment.

DISCLOSURE OF THE INVENTION

In accordance with the above objects, applicants have provided a system for performing electronic burn-in testing of a component comprising a rack which is electrically connectable to a power source. There is a tray on the rack and a mother board is associated with the tray and electrically connectable to the rack. A daughter board is electrically connectable to the mother board and to a component to be tested. The daughter board is electrically dedicated to the component and neither the tray nor the mother board are dedicated to the component. In one embodiment of the invention, racks are provided which accept twelve trays. Each tray in turn has ten positions, each of which accepts one unit to be tested, which unit is wired to a daughter board. It is theoretically possible therefore that 120 different units can undergo simultaneous testing.

In accordance with another feature of the invention, the trays are adjustable in size to accomodate daughter boards of varying sizes and shapes and the racks in turn are adjustable to accomodate trays of varying sizes.

DESCRIPTION OF THE DRAWINGS

These, and other features of the invention including various novel details of construction in combinations of parts, will now be more particularly described with reference to the accompanying drawings and pointed out in the claims. It will be understood that the particular burn-in system embodying the invention are shown by way of illustration only and not as a limitation of the invention. The principals and features of this invention may be employed in varied and numerous embodiments without departing from the scope of the invention.

In the drawings:

FIGS. 10 and 11 are views of a tray just prior to and after having been inserted in the rack respectively.

FIG. 12 a detailed view in rear elevation of a daughter board carrying a unit under test just prior to being inserted in a tray.

BEST MODE FOR CARRYING OUT THE INVENTION

Figure 1:
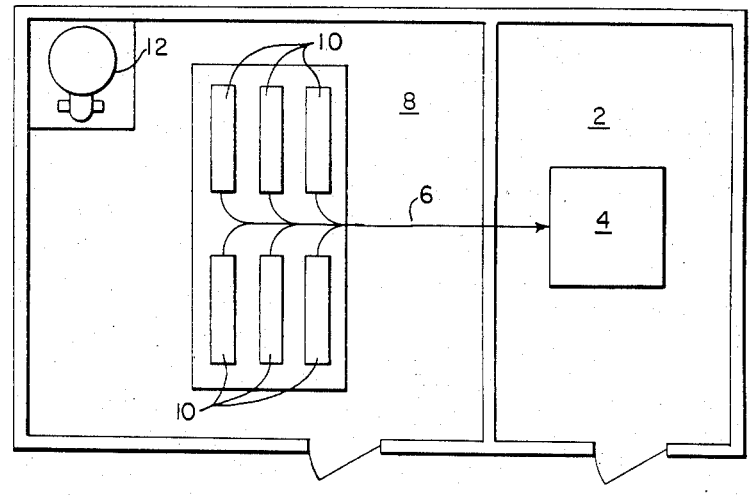
FIG. 1 is a schematic plan view of two contiguous factory test rooms containing electronic test equipment in one and a burn-in system embodying the present invention in the other.

Referring to FIG. 1, there will be seen schematically a plan view of two contiguous hypothetical test rooms in an electronics plant. Room 2 on the right houses electronic test equipment 4 including computing and analyzing equipment. A conduit 6 enters from adjacent room 8 which is a walk-in, burn-in chamber where a plurality of racks 10 are located. Heating means 12 is provided to raise the temperature of the burn-in room including the racks and the units under test, herein also (UUT), to temperatures as high as 85° C. After placing the racks in the burn-in chamber and after they have been loaded with trays containing daughter boards with the UUTs on them, the operator leaves the room thereafter to return only after the test is completed. He switches on the heating means, if such is required in the specific test, turns on the electrical test equipment and thereafter monitors the test results as required.

Figure 3:
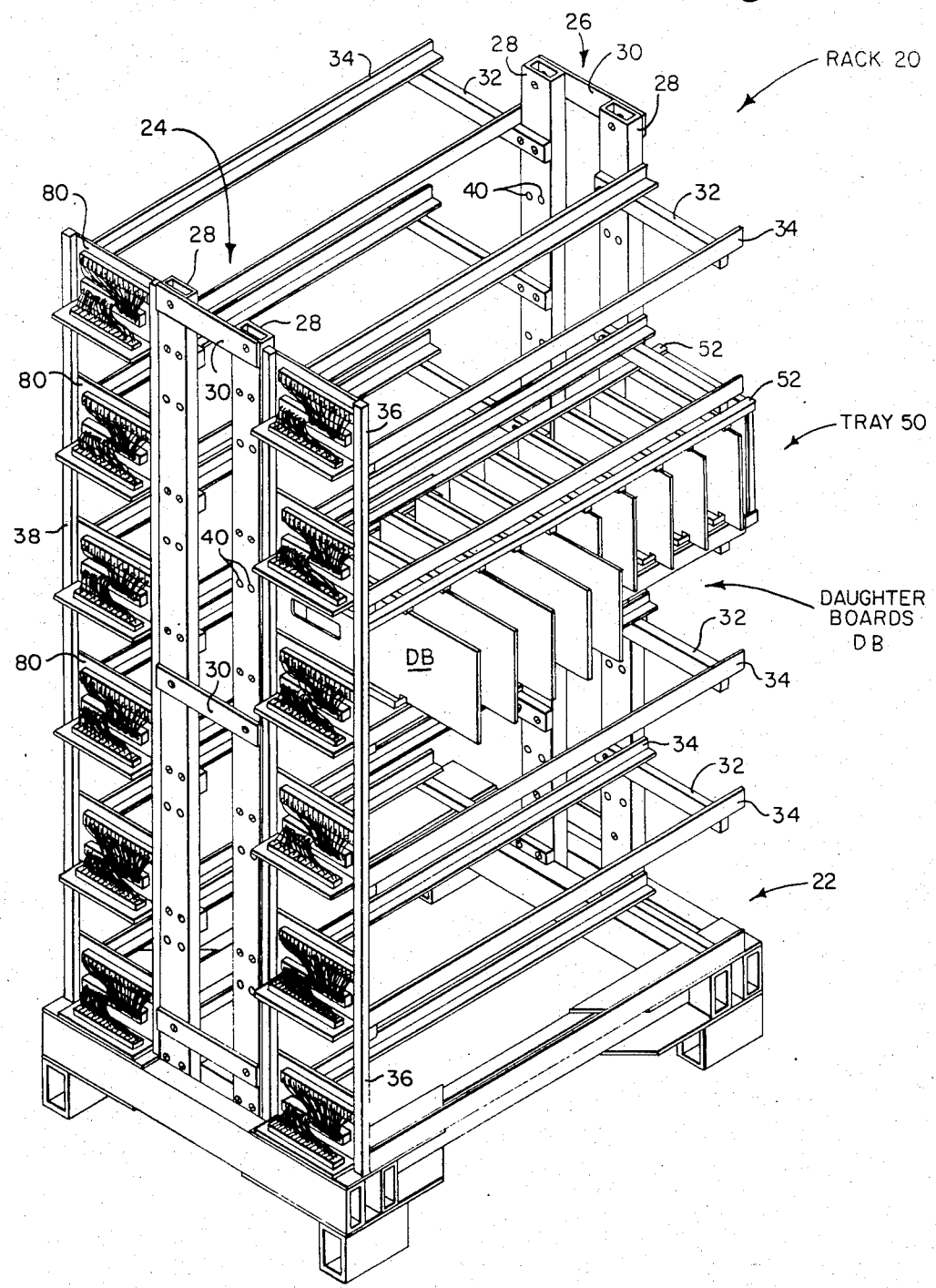
FIG. 3 a perspective view of the present invention embodying a burn-in rack including a tray containing a mother board and daughter boards.
Figure 4:
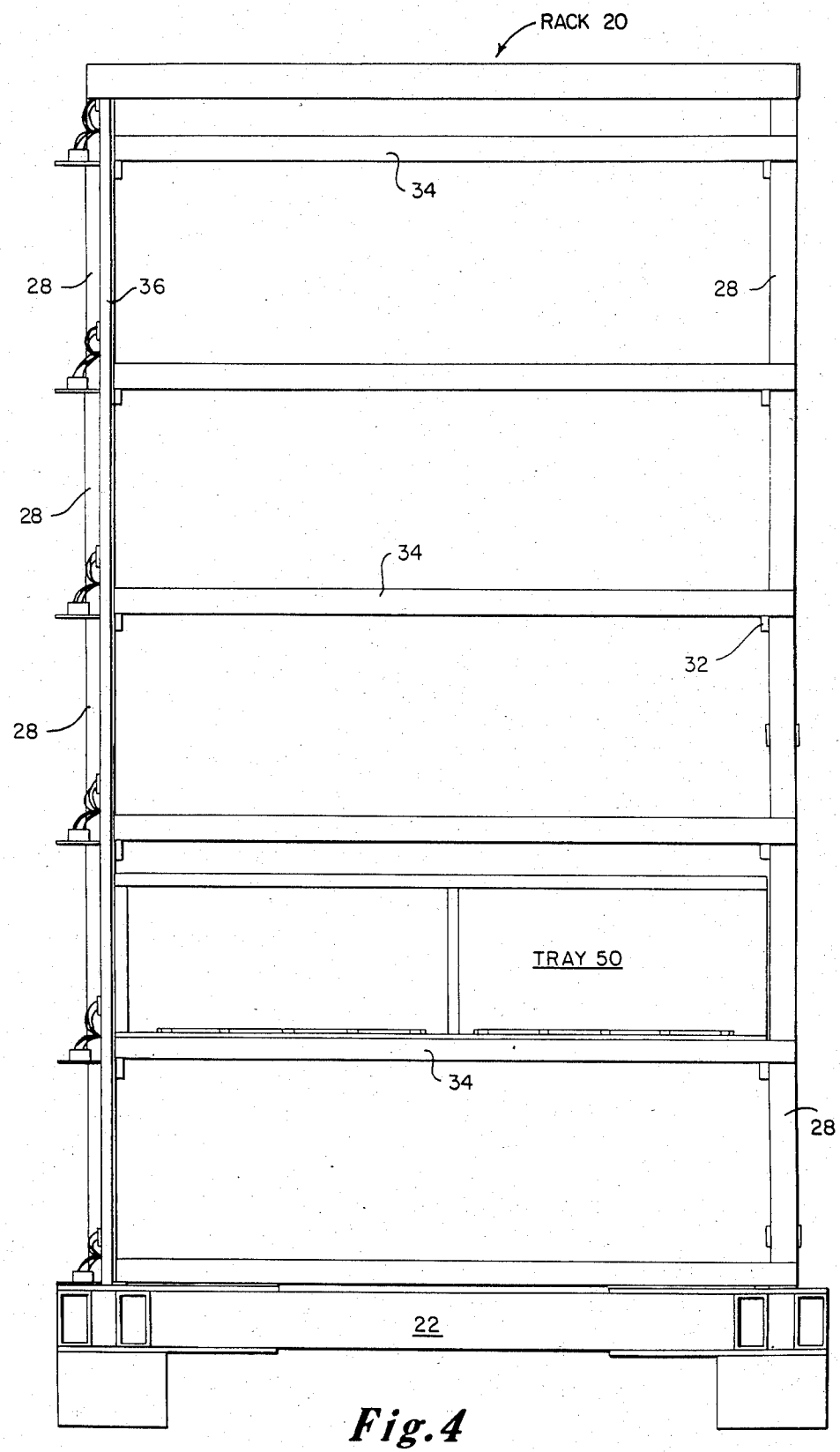
FIG. 4 is a side elevation of a burn-in rack containing one tray.
Figure 5:
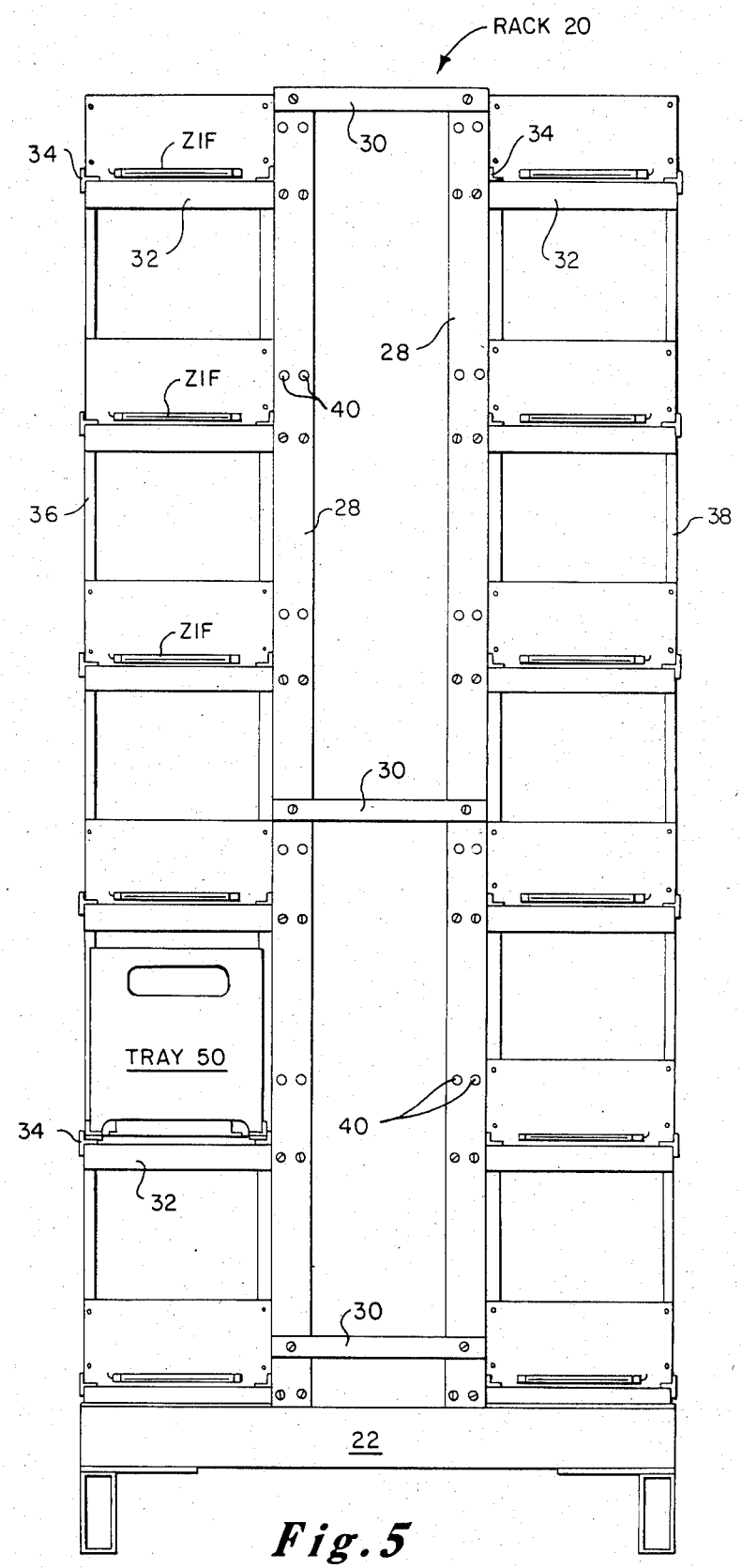
FIG. 5 is a front elevation of a burn-in rack containing one tray.

Referring to FIGS. 3, 4 and 5, there will be seen a perspective view of a rack 20 containing one tray 50 and a plurality of daughter boards DB. The rack 20 is constructed of tubular aluminum and includes a base 22. Upstanding from the base 22 are front and rear vertical supports 24, 26 respectively. Each support is made up of a pair of tubular frame members 28 that are joined by braces 30. Extending laterally from the members 28 are arms 32 supporting guideways 34 made of L and T-shaped aluminum stock.

On the front of the rack, extending outwardly from the supports 24 are front panel frames 36, 38. The arms 32 which mount the guideways 34 are adjustable heightwise with regard to the frame means in prebored holes 40 in the members 28 to accomodate trays of varying heights.

Figure 6:
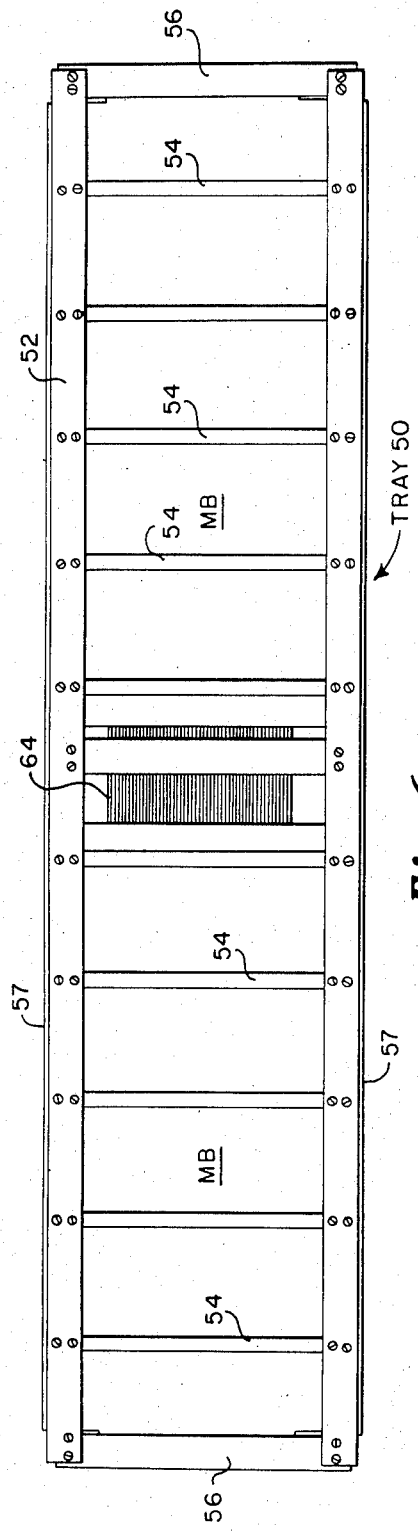
FIGS. 6 and 7 are a plan view and a side elevation respectively of a tray.
Figure 7:
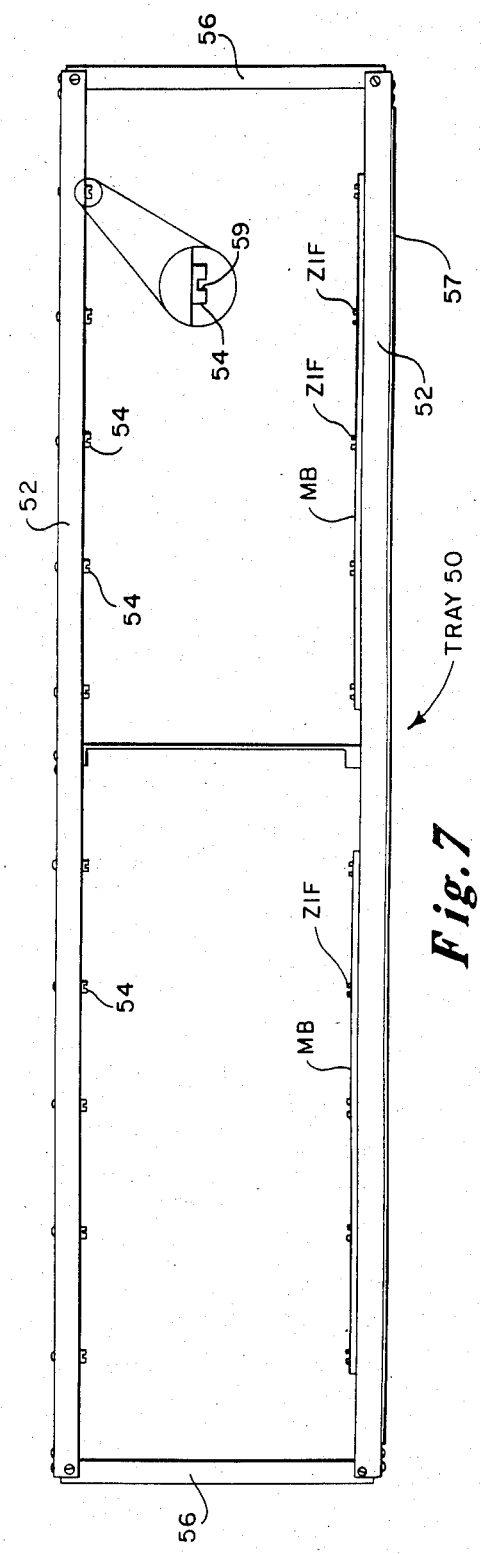

Referring next to FIGS. 6 and 7 a tray will now be described. Each tray 50 comprises four horizontally extending frame members 52. Extending across the upper frame members 52 are guideways 54 each grooved as at 59 to accept the upper edge of a daughter board DB which mounts a separate unit under test UUT, better seen in FIG. 11.

Constituting a portion of the bottom of the tray as viewed in FIG. 7 is the mother board MB which mounts a plurality of zero insertion force connector members (hereinafter ZIF) connectors. The mother board will be described in greater detail hereinafter. Suffice it to say that the ZIF connectors are in vertical alignment with the guideways 54 to accept slidably a daughter board DB as shown in FIGS. 10 and 11. The ends of tray 20 are provided with end plates 56. Nylon glides 57 (seen also in FIG. 12) underlie the lower guide rails 52.

Figures 13, 14:
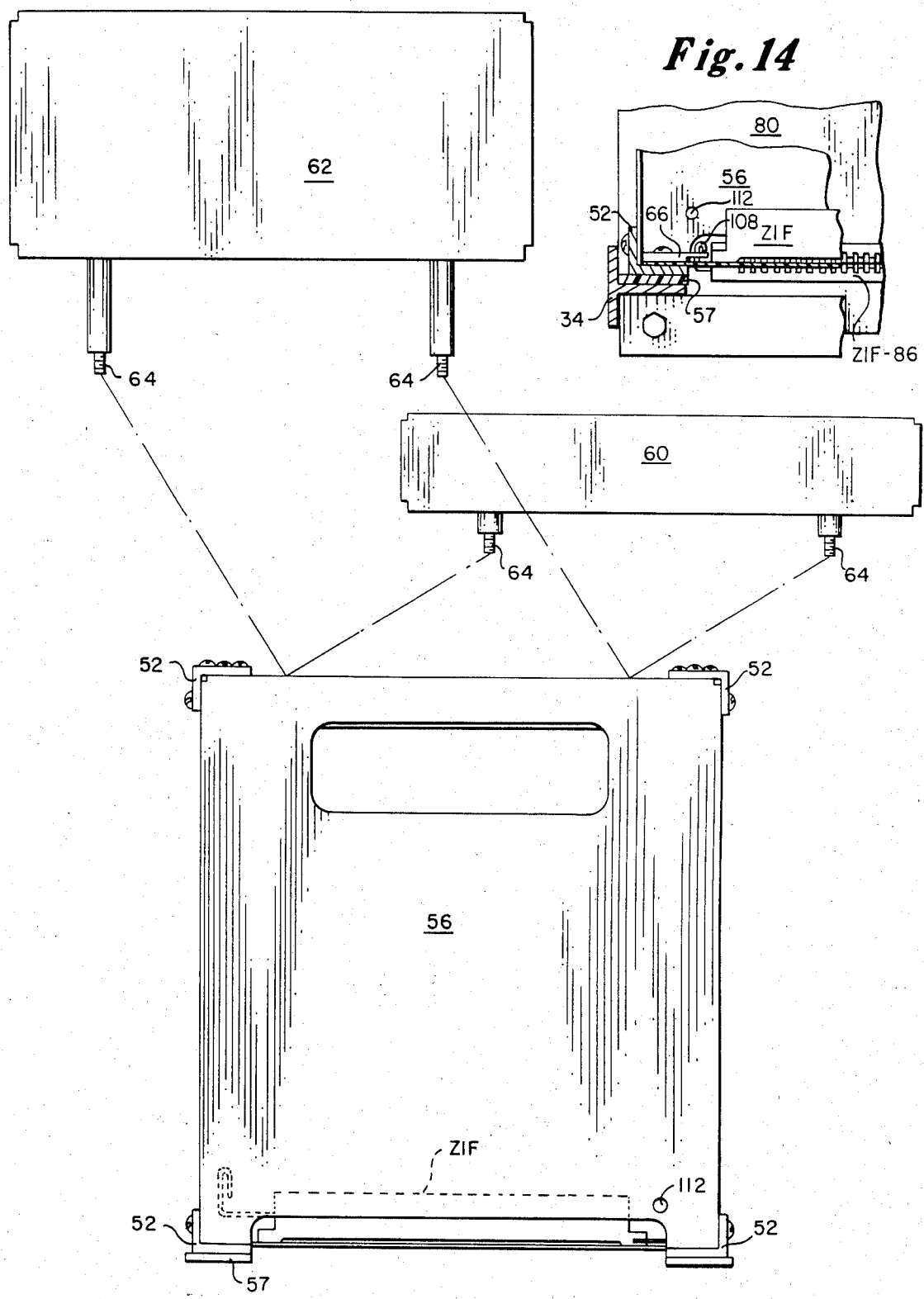
FIG. 13 is a rear elevational view of the end of a tray and add-on plates increase the size of the tray to accomodate a larger size daughter board.
FIG. 14 is a front elevational detail view of the rack and tray in the position seen in FIG. 11.

As seen in FIG. 13 and in dotted outline in FIG. 12 the trays 20 may be increased in height by the addition of spacer plates 60 or 62 which may be secured by threaded connections 64 to the top of the trays, the purpose being to accomodate daughter boards of greater size. Accordingly the rails 34 on the rack 10 would be repositioned in the holes 40 on the rack to accomodate the higher trays. The upper rails 52 would then be repositioned on top of the extender 60, 62.

Figure 8:
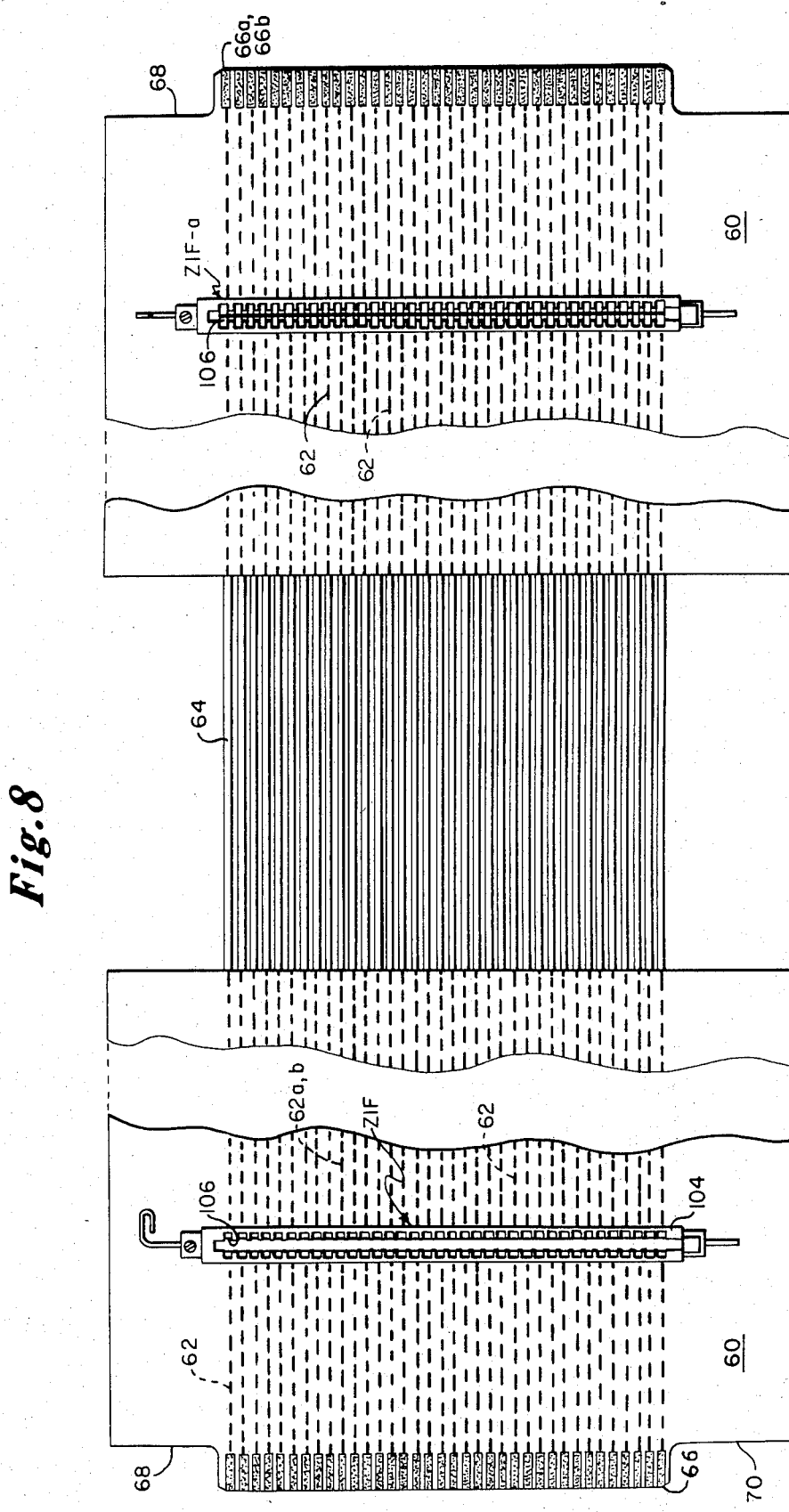
FIG. 8 is a plan view of a mother board.

The mother board will now be described, particularly with reference to FIGS. 2 and 8. They constitute the bottoms of the trays 50 and comprise a pair of printed circuit boards having 36 pairs of conductive paths 62a and 62b in alignment on their upper and lower surfaces. Because the mother boards are made in two pieces, the conductive paths are joined by hard wiring as at 64. The conductive paths terminate in connectors 66 at the ends of the board between notches 68 and 70. The notch 70 being of greater depth than notch 68, makes the boards asymetrical and prevents the boards and hence the trays from being inserted in the racks with the wrong end forward. Ten ZIF connectors, only two of which are seen in FIG. 8, are spaced across the mother boards and soldered to the 36 pairs of conductive paths.

Figure 9:
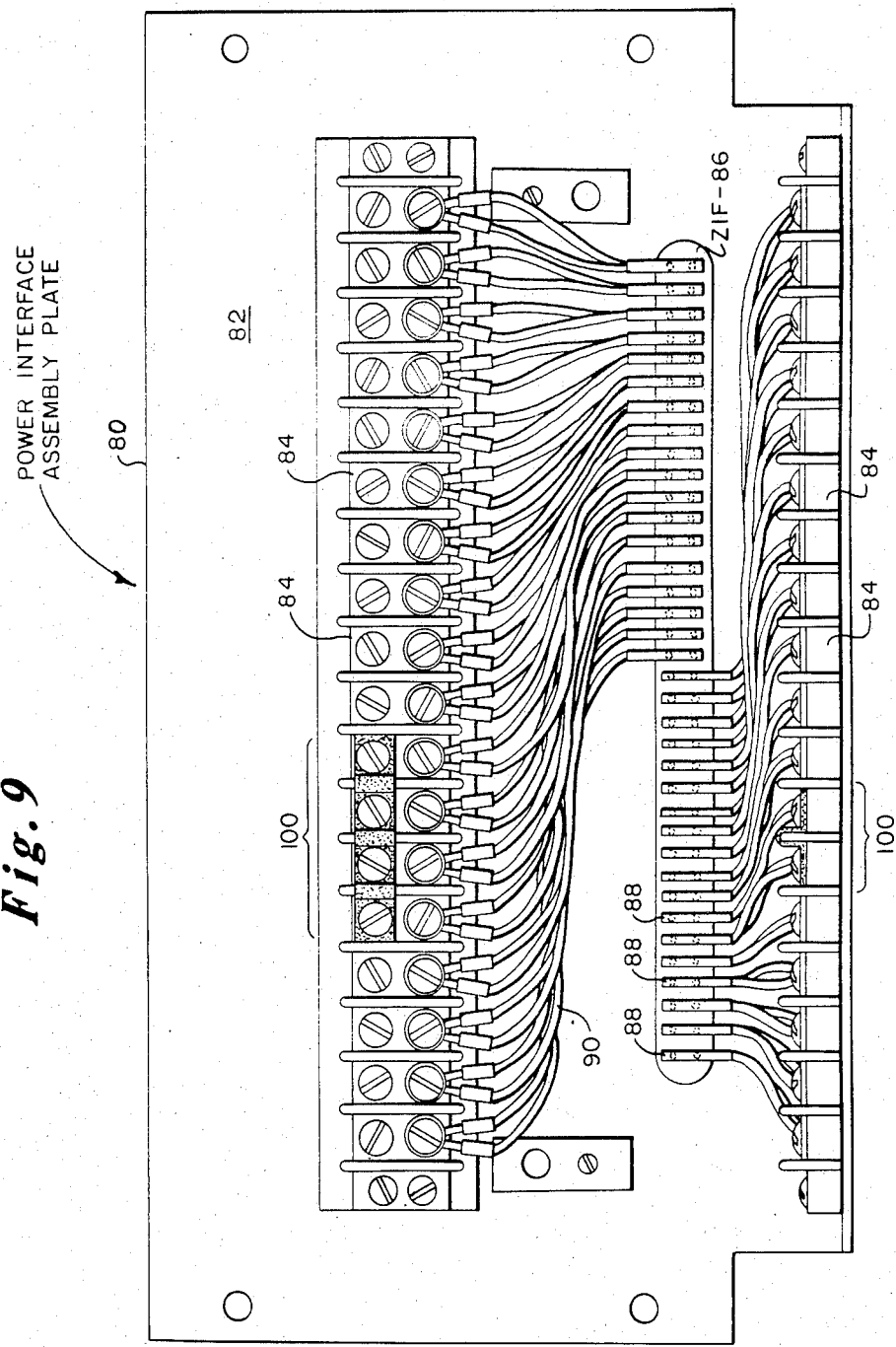
FIG. 9 is a detailed view in front elevation of a power interface assembly plate for connecting a test rack to the electronic test equipment.

Referring next to FIG. 9, there will be seen a power interface assembly plate 80 which connects the rack to the source of power. There is one interface plate for each tray on the rack. They are located vertically at the closed end or the end nearest the viewer as seen in FIG. 3. Each interface plate 80 comprises a mounting panel 82 and 36 hard wire terminals 84 arranged 18 in each of two rows one above the other at right angles on the face of the panel 82. A horizontally extending ZIF connector, ZIF-86 (see FIGS. 10 and 11) extends through the panel 82. Each terminal 84 is hard wired to a contact 88 by means of a wire 90. Any plurality of interface terminals 84 may be bussed together as shown at 100. The interface terminal of each assembly plate 80, there being 12 on the rack shown in FIG. 3, are hard wired to the users electronic control equipment 4 by conduit 6 as seen in FIG. 1.

Each ZIF connector is a commercially available component having a housing 104 (FIG. 8) and 36 pairs of contacts 106, each pair of contacts being electrically soldered in parallel relationship to one of the 36 conductors 62. A tripping lever 108 is located at the end of each ZIF connector to open and close the contacts.

Automatic means for opening and closing the connector ZIF-86 is provided on the forward end of each tray. With reference to FIG. 10, ZIF-86 is located at the lower portion of the mounting panel 82 of the interface plate 80 with its operating lever 108 inclined at about 30° to the horizontal. An aligning pin 110 projects rearwardly from the panel 82. An aperture 112 in the face plate 56 of the tray 50 is aligned with the pin 110. An elongate aperture 114 along the bottom of the faceplate 56 permits the plate to clear the lever 108 as the tray is moved from right to left as viewed in FIG. 10 at which time the aligning pin 110 enters the hole 112 to cam the tray into correct alignment with the then open ZIF-86.

A cam 115 on the leading end of the tray engages the lever 108 moving it upwardly in a counterclockwise direction thereby closing the contacts of ZIF-86 into engagement with the contacts 66 on the mother board to make electrical contact as shown in FIG. 11.

Upon removing the tray from the rack after the test has been completed, when the tray is pulled out or to the right as viewed in FIG. 11, the back of the plate 56, against which the lever 108 has been resting, pulls the lever downwardly in a clockwise direction to open the contacts of ZIF-86.

Signal lights 120, 122 are mounted on the upper left hand edge of each daughter board (see FIG. 12), both being light emitting diodes, the upper LED 120 is red and is wired to the daughter board to indicate that there is power coming from the power source in the electronic test equipment. The lower light 122 is green and when glowing indicates there is a voltage coming from either the unit under test or the daughter board per se.

The daughter boards may be wired with self generating voltage sources where for example the voltage to be applied to one of the elements of the units under test is not a standard voltage or one coming from the electronic test equipment source through one of the 36 leads.

Figure 2:
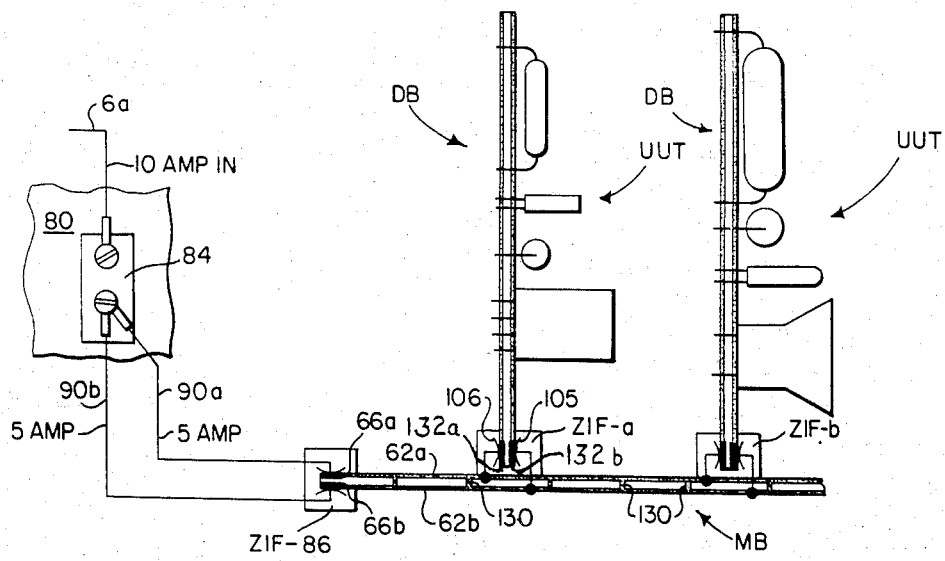
FIG. 2 is a semi-schematic wiring diagram showing the relationship between the mother board, the daughter board and the units under test in side elevation.

Next referring to FIG. 2, there will be seen a modified semi-schematic showing of the circuitry of the burn-in system. Conduit 6 which is a harness of many separate wires, brings voltage to the test racks. One of the separate leads in the conduit 6 is designated 6a and brings a source of test voltage to one of the terminals 84 on the interface assembly plate 80. For illustrative purposes, it will be assumed that lead 6a brings in 10 amps at 5 volts which is one of the test voltages which may be selected by the daughter board.

The current path is split, passing along parallel wires 90a and 90b to the connector ZIF 86 on the back of the interface panel 80. The current path continues, passing to the upper and lower contacts 66a and 66b in the mother board thence through conduits 62a and 62b, through the contacts 105, 106 to the contacts 132a and b on the daughter board. To this point none of the current carrying parts, i.e., the rack, tray or mother board, are dedicated to anything. Five amps of current at 5 volts move along each of the lines 62 and thence to the daughter board which is dedicated by being designed in accordance with the unit under test (UUT). Ten amps at 5 volts is thus delivered to UUT.

Referring to FIG. 12, the daughter board DB is specifically dedicated to the particular unit or component of the unit under test. The component or components are mounted on the daughter board and electrically connected by printed circuit to one of the contacts 132 on the lower edge of the board. When the daughter board is fully inserted into one of the ZIF connectors on the mother board, contact is made with the appropriate contacts 105, 106 in the ZIF connector to select the desired test voltage, in this instance 10 amps at 5 volts. The current returns along another line out of the daughter board DB into the mother board and thence back through the power interface assembly 80 to the source in the electronic test equipment unit.

It will be noted that there are 36 leads, 18 of which can supply 10 amps of current to any particular component of a unit under test while 18 return the current to the source. It is possible however to test more than 18 components at a given time. For example, 24 lines may feed 24 separate components with the remaining 12 lines serving as return conduits when appropriately bussed together.

Thus with the above described non-dedicated rack and tray, unlike or different components may simultaneously be tested.

We claim:

1. A system for performing electronic burn in testing of a module comprising:
   a rack, a removable tray on the rack, a removable daughter board receivable in the tray and a source of a plurality of specific voltages of predetermined amounts,
   the rack having support means for receiving and releasably supporting at least one removable tray, at least one power interface assembly on the rack for connecting the rack to the source of the plurality test voltages, a plurality of releasable electric connectors on the interface assembly for connection to the removable tray,
   the tray having a mother board circuit including a plurality of conductive paths for conducting a specific voltage, each path connected to a contact that is engageable with one of the releasable connectors on the interface assembly,
   means on the mother board for receiving and releasably supporting a removable daughter board, a plurality of releasable connectors on the mother board each connected to a conductive path to supply a specific voltage to the daughter board,
   the daughter board having a plurality of contacts, each engageable with one of the releasable electric contacts on the mother board,
   the module being mounted on the daughter board and wired to at least one of the contacts on the daughter board to receive the specific test voltage in the conductive path in the mother board to which the contact is connected,
   the daughter board having signal means to indicate the presence of test voltage across the module,
   the daughter board having means to indicate the presence of voltage generated from the module or the daughter board,
   and means to electrically connect and disconnect the rack and the tray automatically upon the tray being moved into and out of the rack.

2. A system in accordance with claim 1 in which the rack has a plurality of means for receiving, supporting and supplying test voltage to a plurality of trays simultaneously.

3. A system in accordance with claim 1 in which the mother board has a plurality of means for receiving, supporting and supplying test voltage to a plurality of daughter boards simultaneously.

* * * * *